(12) United States Patent
Assefa et al.

(10) Patent No.: US 8,563,225 B2
(45) Date of Patent: Oct. 22, 2013

(54) FORMING A SELF-ALIGNED HARD MASK FOR CONTACT TO A TUNNEL JUNCTION

(75) Inventors: Solomon Assefa, Ossining, NY (US); Sivananda K. Kanakasabapathy, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 702 days.

(21) Appl. No.: 12/126,245

(22) Filed: May 23, 2008

(65) Prior Publication Data
US 2009/0291388 A1 Nov. 26, 2009

(51) Int. Cl.
*G03F 7/30* (2006.01)

(52) U.S. Cl.
USPC .......................... 430/314; 430/317; 430/318

(58) Field of Classification Search
USPC ......................................... 430/314, 317, 318
See application file for complete search history.

(56) References Cited

U.S. PATENT DOCUMENTS

| 4,374,698 A | 2/1983 | Sanders et al. |
| 4,717,447 A | 1/1988 | Dieleman et al. |
| 2006/0014305 A1 * | 1/2006 | Lee et al. ............................ 438/3 |
| 2009/0173977 A1 * | 7/2009 | Xiao et al. ..................... 257/295 |

OTHER PUBLICATIONS

U.S. Appl. No. 11/619,623 filed in the name of S. Assefa et al. on Jan. 4, 2007 and entitled "Method of Forming Vertical Contacts in Integrated Circuits."

* cited by examiner

*Primary Examiner* — Daborah Chacko Davis

(74) *Attorney, Agent, or Firm* — Vazken Alexanian; Ryan, Mason & Lewis, LLP

(57) ABSTRACT

A method of forming a hard mask in a semiconductor device which is self-aligned with a MTJ formed in the device is provided. The method includes the steps of: forming a hard mask material layer on an upper surface of a magnetic stack in the MTJ; forming an anti-reflective coating (ARC) layer on at least a portion of an upper surface of the hard mask material layer, the ARC layer being selected to be removable by a wet etch; forming a photoresist layer on at least a portion of an upper surface of the ARC layer; removing at least a portion of the photoresist layer and the ARC layer to thereby expose at least a portion of the hard mask material layer; etching the hard mask material layer to remove the exposed portion of the hard mask material layer; and performing a wet strip to remove remaining portions of the ARC layer and photoresist layer in a same processing step without interference to the magnetic stack.

14 Claims, 4 Drawing Sheets

FORMING A SELF-ALIGNED HARD MASK FOR CONTACT TO A TUNNEL JUNCTION

FIELD OF THE INVENTION

The present invention is directed generally to semiconductors, and more particularly to techniques for fabricating sub-micron tunnel junctions.

BACKGROUND OF THE INVENTION

The fabrication of magnetic tunnel junctions (MTJs), and, in particular, patterning and hard mask over-etching processes relating to the formation of MTJs, remains a challenge in forming magnetoresistive random access memory (MRAM) integrated circuits, especially concerning smaller MTJs, such as sub-micron and sub-100 nanometer (nm) MTJs. Patterning of MTJs often requires a self-aligned hard mask. The MTJ is typically formed and electrically coupled to an overlying metal interconnect by depositing a relatively thick metallic hard mask layer on top of the many layers of magnetic and nonmagnetic materials that will make up the MTJ. This hard mask layer is patterned into a desired shape by conventional photolithography and reactive ion etching (RIE). The MTJ layers are then patterned using the hard mask layer as a self-aligned mask structure. Afterwards, an inter-layer dielectric (ILD) layer is deposited on the structure and polished so that it has a flat upper surface. Conventional photolithography and RIE are then used again to pattern a trench into the ILD layer in the shape of a desired interconnect feature. The trench is formed such that the thick hard mask layer protrudes into the trench. Finally, the trench is filled with a metallic material in order to form the interconnect feature. The thick hard mask layer therefore serves as both an etch mask and a contact that connects the MTJ to the top electrode. Hence, the hard mask needs to be patterned cleanly. More importantly, the patterning of the hard mask needs to be done in a manner that is benign to the magnetic stack.

Unfortunately, in current MTJ fabrication approaches, a photoresist strip step that conventionally follows the hard mask over-etch step often leaves behind a photoresist spine. Furthermore, the photoresist strip after the hard mask over-etch process leads to an etching into the magnetic stack and results in a non-uniform field area and unknown thickness, which is undesirable.

SUMMARY OF THE INVENTION

Embodiments of the present invention address the above-identified problems in forming a self-aligned hard mask for electrical contact to a MTJ device by providing a method of forming the hard mask in a manner that is benign to the magnetic stack in the MTJ device.

In accordance with an aspect of the invention, a method of forming a hard mask in a semiconductor device which is self-aligned with a MTJ formed in the device is provided. The method includes the steps of: forming a hard mask material layer on an upper surface of a magnetic stack in the MTJ; forming an anti-reflective coating (ARC) layer on at least a portion of an upper surface of the hard mask material layer, the ARC layer being selected to be removable by a wet etch; forming a photoresist layer on at least a portion of an upper surface of the ARC layer; removing at least a portion of the photoresist layer and the ARC layer to thereby expose at least a portion of the hard mask material layer; etching the hard mask material layer to remove the exposed portion of the hard mask material layer; and performing a wet strip to remove remaining portions of the ARC layer and photoresist layer in a same processing step without interference to the magnetic stack.

By carefully selecting the hard mask over-etch chemistry, the hard mask etch is stopped at the desired cap layer. This eliminates interference with the magnetic stack. Furthermore, by combining RIE of the hard mask and wet processing to remove the resist mask, the process provides a clean surface after hard mask over-etch. As a result, the method gives a uniform point for RIE or ion mill of the magnetic stack. Finally, the method works both for MRAM at current generation and next-generation nodes.

In accordance with another aspect of the invention, a magnetic memory cell includes a magnetic storage element formed on a semiconductor substrate, and a hard mask which is self-aligned with the magnetic storage element. The hard mask includes: a hard mask material layer formed on an upper surface of a magnetic stack in the magnetic storage element; an anti-reflective coating (ARC) layer formed on at least a portion of an upper surface of the hard mask material layer, the ARC layer being selected to be removable by a wet etch; and a photoresist layer formed on at least a portion of an upper surface of the ARC layer. Selected portions of the ARC layer and photoresist layer are removed in a same processing step without interference to the magnetic stack.

These and other features, objects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative embodiments of a MTJ device and exemplary steps in a method of fabrication thereof. It is to be appreciated, however, that the techniques of the present invention are not limited to the device and methods shown and described herein. Rather, embodiments of the invention are directed broadly to improved techniques for formation a self-aligned hard mask for contact to a tunnel junction. For this reason, numerous modifications can be made to these embodiments and the results will still be within the scope of the invention. For instance, while the illustrative embodiments describe integrated circuits comprising MTJs and various metallization features, the invention is not limited to these particular features. No limitations with respect to the specific embodiments described herein are intended or should be inferred.

Although combined in a novel manner, most of the processing steps described herein (e.g., deposition steps, etching steps and photolithography steps) are frequently performed in conventional semiconductor processing, and, as result, will be familiar to one skilled in that art. Moreover, details of the individual processing steps used to fabricate semiconductor devices described herein may be found in a number of publications, for example, S. Wolf and R. N. Tauber, *Silicon Processing for the VLSI Era, Volume* 1, Lattice Press, 1986; S. Wolf, *Silicon Processing for the VLSI Era, Vol. 4: Deep-Submicron Process Technology*, Lattice Press, 2003; and S. M. Sze, *VLSI Technology, Second Edition*, McGraw-Hill, 1988, all of which are incorporated herein by reference. It is also emphasized that the descriptions provided herein are not intended to encompass all of the processing steps which may be required to successfully form a functional device. Rather, certain processing steps which are conventionally used in forming integrated circuit devices, such as, for example, wet cleaning and annealing steps, are purposefully not described herein for economy of description. However one skilled in the art will readily recognize those processing steps omitted from this generalized description.

It should also be understood that the various layers and/or regions shown in the accompanying figures may not be drawn to scale, and that one or more semiconductor layers and/or regions of a type commonly used in such integrated circuits may not be explicitly shown in a given figure for ease of explanation. This does not imply that the semiconductor layers and/or regions not explicitly shown are omitted from the actual integrated circuit.

Figure 1:
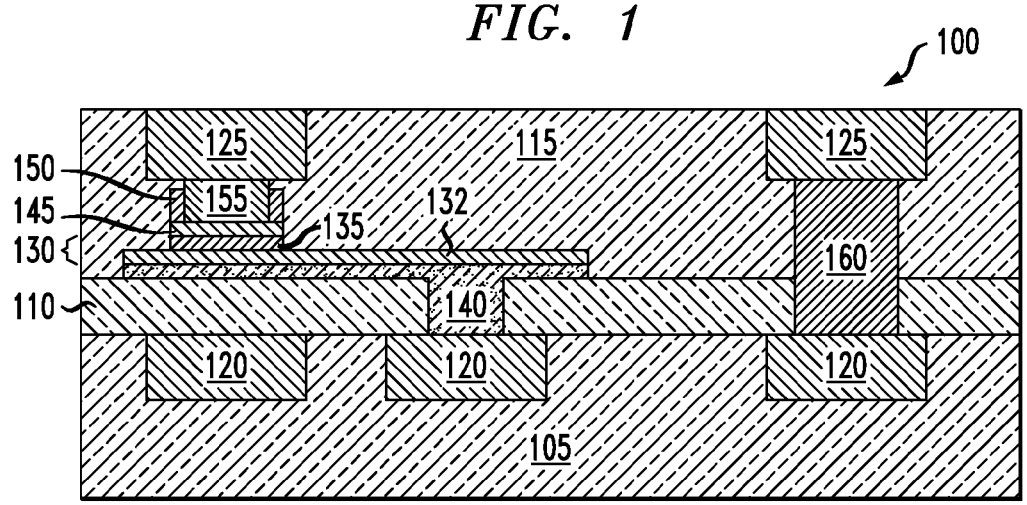
FIG. 1 is a cross-sectional view depicting at least a portion of an integrated circuit, in accordance with an illustrative embodiment of the invention.

FIG. 1 is a cross-sectional view depicting at least a portion of an integrated circuit 100 in accordance with an illustrative embodiment of the invention. For purposes of this embodiment, the integrated circuit 100 comprises an MTJ 130, also referred to herein as a magnetic stack, that occupies a region between two metallization levels. More particularly, the integrated circuit 100 comprises a lower ILD layer 105, a middle ILD layer 110 and an upper ILD layer 115. Built into these ILD layers are various metal interconnects, namely, lower metal interconnects 120 and upper metal interconnects 125. MTJ 130 occupies a leftmost portion of the integrated circuit 100. The MTJ 130 comprises a lower MTJ layer 132 and an upper MTJ layer 135. The lower MTJ layer contacts the central lower metal interconnect 120 through an MTJ electrode 140 formed therebetween. Built on top of the upper MTJ layer 135 is an MTJ hard mask layer 145 and an etch stop layer 150. An MTJ vertical contact 155 electrically couples the MTJ hard mask layer 145 to the leftmost upper metal interconnect 125. A metallization vertical contact 160 electrically couples the rightmost upper metal interconnect 125 to the rightmost lower metal interconnect 120.

A function of the etch stop layer 150 will become more evident below when describing a process for forming the integrated circuit 100. In accordance with an aspect of the invention, both the etch stop layer 150 and the middle ILD layer 110 comprise the same dielectric material, while the upper ILD layer 115 comprises a dielectric material different from the etch stop layer and the middle ILD layer. For example, the etch stop layer 150 and the middle ILD layer 110 may comprise silicon nitride, while the upper ILD layer 115 may comprise silicon oxide, although the invention is not limited to these materials. The MTJ electrode layer 140 will preferably comprise a refractory material such as, for example, tantalum, tantalum nitride, titanium or titanium nitride. Moreover, the lower metal interconnects 120, the upper metal interconnects 125, the MTJ vertical contact 155 and the metallization vertical contact 160 will preferably comprise a conductive metal like copper or aluminum. The MTJ hard mask layer 145 will preferably comprise a metallic material such as, but not limited to, tantalum, tantalum nitride, aluminum, copper, titanium, titanium nitride, tungsten, platinum and ruthenium. It is to be understood that alternative materials for forming these various integrated circuit layers and structures are similarly contemplated.

The MTJ 130, moreover, preferably comprises various sublayers that give the MTJ the ability to store a logic state, as may be used, for example, in a memory cell application. The compositions, functions and arrangements of the various sublayers that may form the MTJ will be familiar to those skilled in the art. An MTJ will typically comprise a free ferromagnetic layer and a fixed ferromagnetic layer separated by a thin dielectric barrier (e.g., a tunnel barrier). A resistance of the memory cell depends on the direction of magnetization of the free ferromagnetic layer relative to the direction of magnetization of the fixed ferromagnetic layer. In other words, the magnetization of the free layer may be oriented parallel or anti-parallel to the fixed layer, representing either a logic "0" or a logic "1," as may be arbitrarily assigned. The state of the MTJ memory cell can be sensed by measuring the resistance of the MTJ.

Many different materials may be used in the MTJ 130 such as cobalt-iron, cobalt-iron-boron, nickel-iron, platinum-manganese, ruthenium, aluminum oxide, manganese oxide, iridium-manganese, as well as others and/or combinations or one or more of these materials. Each of the lower and upper MTJ layers 132, 135 will comprise some subset of the various sublayers that form the MTJ. The lower MTJ layer 132 may, for example, comprise the fixed ferromagnetic layer and dielectric barrier of the MTJ, while the upper MTJ layer 135 may comprise the free ferromagnetic layer. Nonetheless, the particular arrangement and composition of the sublayers forming the MTJ and their particular separation into the lower and upper MTJ layers are not critical to the functionality of aspects of the invention.

Figure 2A:
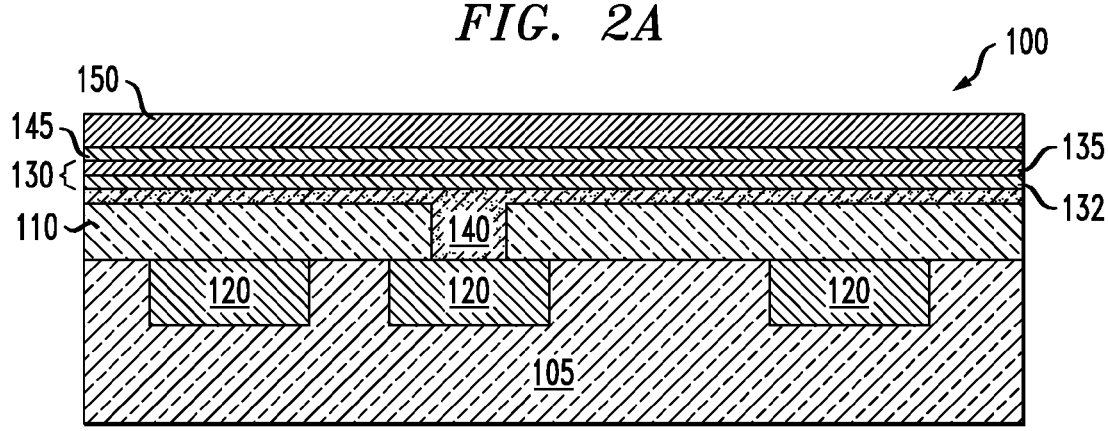
FIGS. 2A-2F are cross-sectional views depicting the illustrative integrated circuit shown in FIG. 1 during various stages of processing of the integrated circuit, in accordance with an embodiment of the invention.

FIGS. 2A-2F are cross-sectional views depicting the illustrative integrated circuit 100 of FIG. 1 during various stages of processing of the integrated circuit according to an embodiment of the invention. FIG. 2A shows the integrated circuit 100 after the lower and middle ILD layers 105 and 110, respectively, and the lower metal interconnects 120 have been formed. In addition, the MTJ electrode 140 has been deposited and polished such that it fills an opening formed through the middle ILD layer 110 and contacts the central lower metal interconnect 120. What is more, the lower and upper MTJ layers 132 and 135, respectively, the MTJ hard mask layer 145 and the etch stop layer 150 have been blanket deposited on an upper surface of the MTJ electrode 140. As described above, the dielectric etch stop layer and the middle ILD layer preferably comprise the same dielectric material (e.g., silicon nitride or silicon oxide).

Figure 2B:
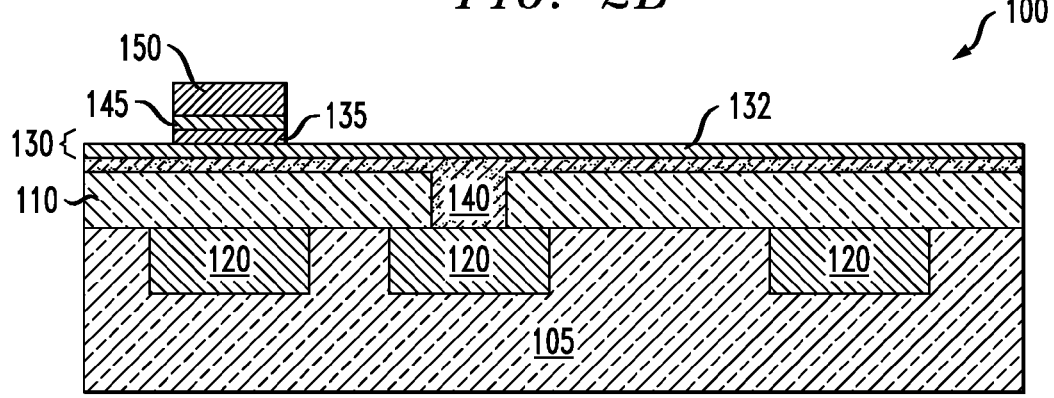
Figure 2C:
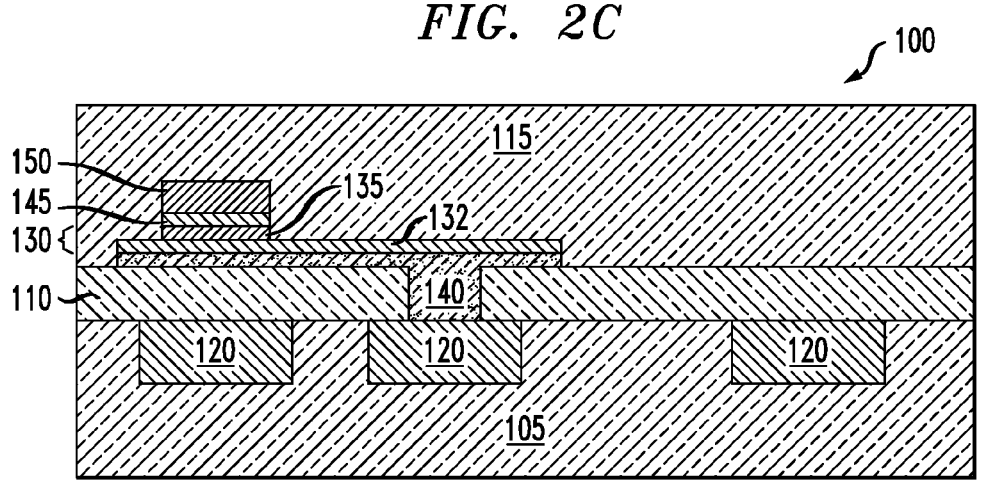

Once formed to this point, conventional photolithography and RIE, or an alternative suitable anisotropic etching technique, are used to pattern the etch stop layer 150, the MTJ hard mask layer 145 and the upper MTJ layer 135 as desired, as shown in FIG. 2B. As is well known by those skilled in the art, the term "patterning" relates to a series of processes that shape or alter the existing shape of deposited materials and is generally referred to as lithography. For example, in a standard photolithographic process, a semiconductor wafer is coated with a photoresist. The photoresist is then exposed to short wavelength light through a mask using a stepper machine which focuses, aligns, and moves the mask. The unexposed portions of the photoresist are washed away by a developer solution. After etching or other subsequent processing, the remaining photoresist is removed, such as by plasma ashing. Subsequently, conventional photolithography and RIE are used again to remove portions of the lower MTJ layer 132 and the MTJ electrode 140 overlying the rightmost lower metal interconnect 120. Upper ILD layer 115 is then deposited on the film stack comprising etch stop layer 150, hard mask layer 145 and MTJ 130, either conformally or using an alternative deposition technique, and polished to create a substantially planar upper surface, as shown in FIG. 2C.

Figure 2D:
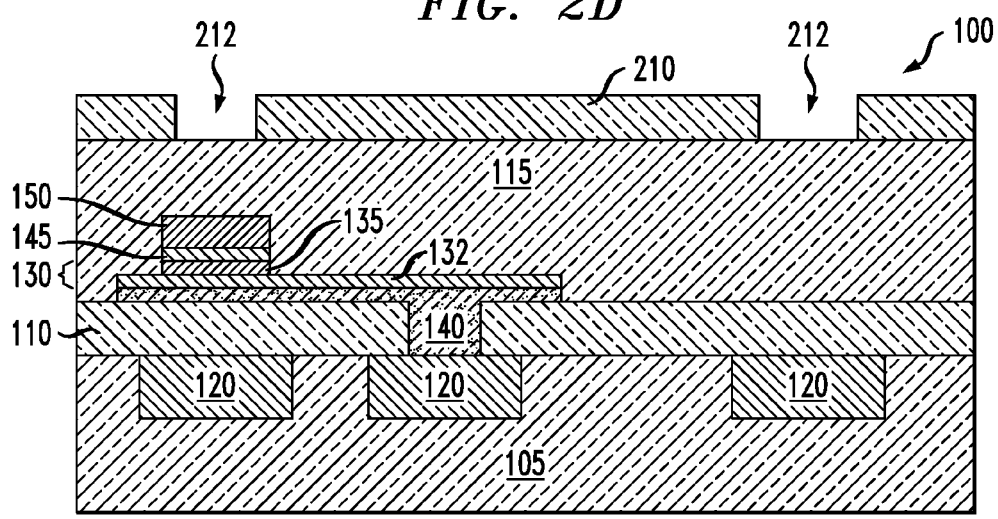

A photolithographic mask 210 is then formed on the upper surface of upper ILD layer 115 and patterned as desired, as shown in FIG. 2D. The photolithographic mask 210 defines openings 212 where vertical contacts are to be formed, namely, over the MTJ 130 and the rightmost lower metal interconnect 120. If desired, the openings 212 over the MTJ and the rightmost lower metal interconnect may have different diameters, ultimately resulting in an MTJ vertical contact 155 and a metallization vertical contact 160 (see FIG. 1) with different diameters. With reference again to FIG. 1, it may, for example, be advantageous to have the MTJ vertical contact 155 have a smaller diameter than the metallization vertical contact 160. The MTJ vertical contact 155 is required to land on the MTJ which may be relatively small in comparison to the metal interconnect. In contrast, it may be desirable to make the metallization vertical contact 160 relatively large to reduce the electrical resistance of this contact and to reduce resistance-capacitance induced delays in the integrated circuit's metallization levels.

Figure 2E:
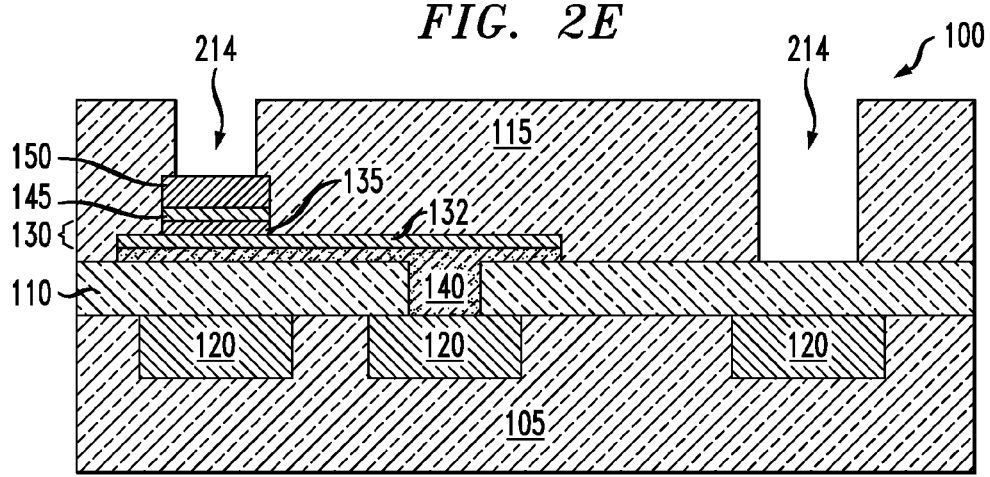

Referring again to FIG. 2D, with the above-described photolithographic mask 210 in place, the integrated circuit 100 is preferably exposed to another RIE process. In accordance with an aspect of this invention, this RIE process etches the upper ILD layer 115 through the openings 212 in the photolithographic mask until it reaches either the etch stop layer 150 or the middle ILD layer 110. FIG. 2E illustrates the integrated circuit 100 after etching the upper ILD layer 115 to form openings 214 therein and after the photolithographic mask 210 is stripped. If, for example, the etch stop layer 150 and middle ILD layer 110 comprise silicon nitride and the upper ILD layer 115 comprises silicon oxide, then this RIE process would preferably etch silicon oxide with a relatively high rate but not etch, or only very slowly etch, silicon nitride. Conversely, if the etch stop layer 150 and middle ILD layer 110 comprise silicon oxide and the upper ILD layer 115 comprises silicon nitride, then the opposite would be true; the RIE process would preferably selectively etch silicon nitride and only slowly etch silicon oxide. Thus, the etchant used in the RIE process is preferably selected to have a substantially greater affinity for etching one material type (e.g., silicon oxide) over another material type (e.g., silicon nitride).

Advantageously, the etch stop layer 150 in combination with a selective RIE process allows a single RIE process to etch holes in two different portions of the integrated circuit 100 that have substantially different depths and, optionally, different diameters. RIE processes that etch silicon nitride or silicon oxide selectively to one another are frequently practiced in conventional semiconductor processing. As a result, the details of these processes will be familiar to one skilled in the art and need not be detailed herein. These selective RIE processes frequently comprise various combinations of reactants such as, but not limited to, $CH_xF_{4-x}$, $C_xF_{x+2}$ (e.g., $C_2F_6$ and $C_3F_8$), $SiF_4$, $NF_3$, HBr, $O_2$, $H_2$ and Ar, where x is an integer. Reactants suitable for use with the present invention are described in, for example, U.S. Pat. No. 4,374,698, entitled "Method of manufacturing a semiconductor device," and U.S. Pat. No. 4,717,447, entitled "Method of manufacturing a semiconductor device by means of plasma etching," both of which are incorporated herein by reference.

Figure 2F:
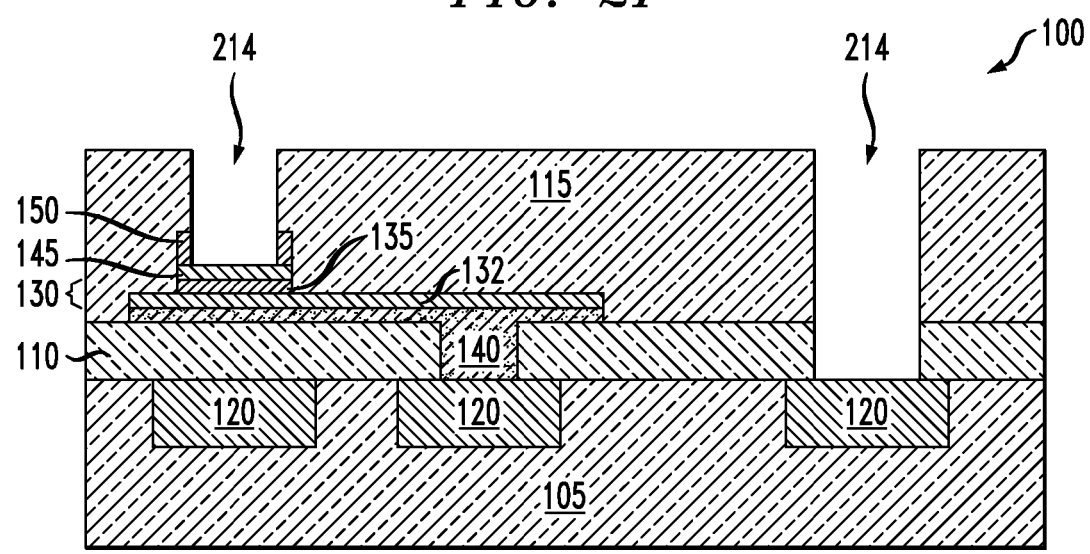

After this selective RIE process is completed, the integrated circuit 100 is exposed to another RIE process. In contrast to the previous RIE process, this second RIE process is configured to selectively etch the dielectric material constituting the etch stop layer 150 and the middle ILD layer 110 and to only very slowly etch the dielectric material constituting the upper ILD layer 115. The second RIE process will also preferably not etch, or only very slowly etch, metallic materials. Accordingly, this RIE process extends the leftmost opening 214 in the upper ILD layer 115 through the etch stop layer 150 to the MTJ hard mask layer 145 and extends the rightmost opening 214 in the upper ILD layer through the middle ILD layer 110 to the rightmost lower metal interconnect 120, as shown in FIG. 2F. If the etch stop layer 150 and the middle ILD layer 110 are of approximately the same thickness, it is unnecessary to overetch to any great extent on either the MTJ hard mask layer 145 or on the lower metal interconnect 120 during this RIE process. In this manner, damage to these metallic features from this RIE process can be beneficially minimized.

RIE processes that etch dielectric materials selectively with respect to metal materials are known in the semiconductor art and, therefore, need not be detailed herein. The fluorine-containing reactants described above for use in etching silicon nitride and silicon oxide, for example, typically do not readily etch metallic materials. Instead, chlorine- and/or boron-containing RIE reactants such as $Cl_2$, $CCl_2$, $BCl_3$, $SiCl_4$ and HBr are frequently used to etch metallic features.

In subsequent processing, trenches may be formed in the upper ILD layer 115, such as, for example, by conventional photolithography and RIE, in the shape of the desired upper metal interconnects 125. Deposition of a metallic material into the resulting trench openings and the removal of any excess metallic material from the top of the upper ILD layer, such as by polishing or an alternative planarization process, results in the formation of the MTJ vertical contact 155, the metallization vertical contact 160 and the upper metal interconnects 125. Subsequent to this processing, the integrated circuit 100 appears as shown in FIG. 1.

One skilled in the art will recognize that several changes and/or modification can be made to the features and the processes described herein and the results will still come within the scope of this invention.

An important aspect of the present invention is the formation of a self-aligned hard mask within an MTJ device in a manner that is benign to the magnetic stack. It is primarily a separate anti-reflective coating (ARC) etch which can undesirably affect the magnetic stack. By using a prescribed photoresist combination, a methodology for forming an MTJ device which essentially bypasses the need for a separate ARC etch is advantageously achieved. Specifically, the usage of an ARC layer which is removable by a wet etch allows the hard mask to be patterned cleanly and without interference to the magnetic stack. Through careful selection of hard mask open (HMO) chemistry, the hard mask etch is preferably stopped precisely at a desired cap layer. Furthermore, by combining RIE of the hard mask and with wet etching to remove the resist mask, the process provides a clean surface after HMO. As a result, the method provides a uniform starting point for RIE or ion mill of the magnetic stack.

Figure 3:
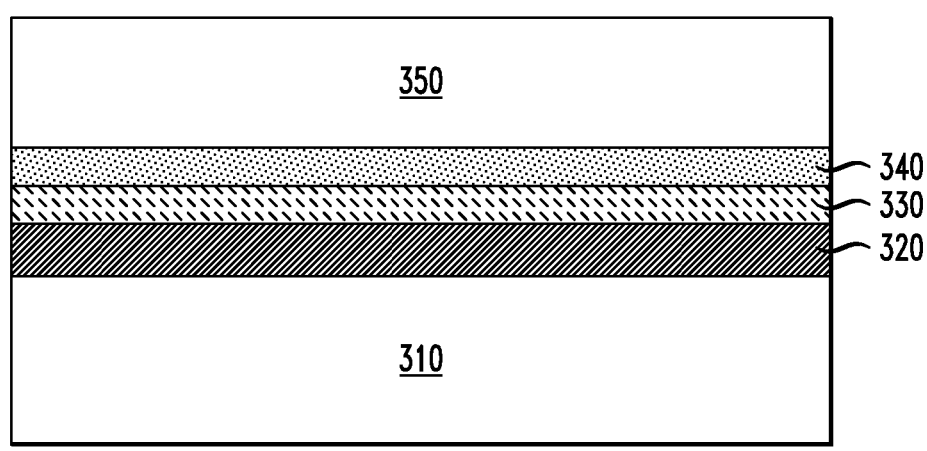
FIG. 3 is a cross-sectional view depicting at least a portion of an exemplary MTJ before patterning and formation of the hard mask, in accordance with an embodiment of the invention.

FIG. 3 is a cross-sectional view depicting at least a portion of an exemplary MTJ 300 before patterning and formation of the hard mask, in accordance with an embodiment of the invention. The MTJ 300 comprises a substrate 310, a magnetic stack layer 320 formed on an upper surface of the substrate, a hard mask material layer 330 (hard mask) formed on an upper surface of the magnetic stack layer, an ARC layer 340 formed on an upper surface of the hard mask layer, and a photoresist layer 350 formed on an upper surface of the ARC layer. In accordance with an embodiment of the invention, the ARC layer 340 is configured to be removable by a wet etching process. This can be achieved through the selection of an appropriate material for the ARC layer in conjunction with the selection of a corresponding wet etchant having high selectivity for etching the ARC layer.

An important consideration in any etching process is the selectivity of the etchant. An etchant not only attacks the material being removed, but the mask and the substrate (the surface under the material being etched) as well. The selectivity of an etchant generally refers to its ability to remove only the material intended for etching, while leaving the mask and substrate materials intact. Selectivity, S, can be measured as a ratio between the different etch rates of the etchant for different materials. Thus, in the case of ARC layer 340, a suitable etchant preferably has a high selectivity value with respect to both the hard mask and the substrate, i.e., its etching rate for the ARC layer being etched should be substantially higher than its etching rates for both the hard mask and substrate materials other than the ARC layer. Despite the resolution limitations often associated with wet etching, it is advantageous primarily because of its low cost, high reliability, high throughput and excellent selectivity in most cases with respect to both mask and substrate materials.

Figure 4A:
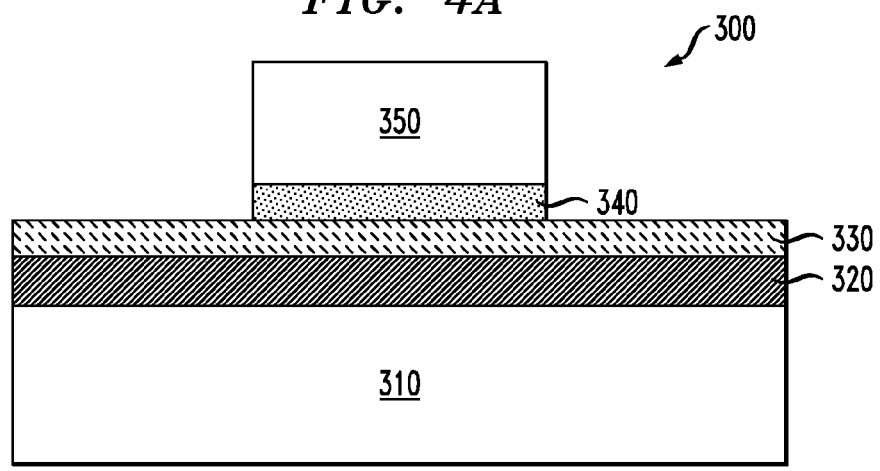
FIGS. 4A-4C are cross-sectional views depicting exemplary processing steps in the formation of an MTJ, in accordance with an embodiment of the invention.
Figure 4B:
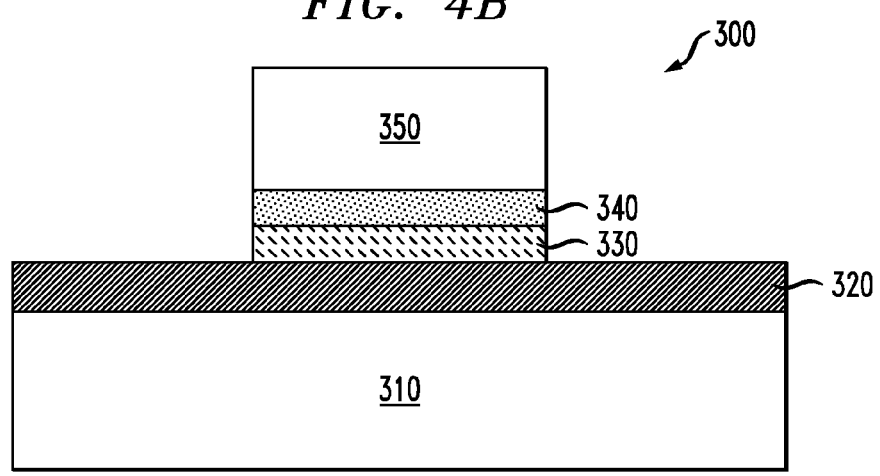
Figure 4C:
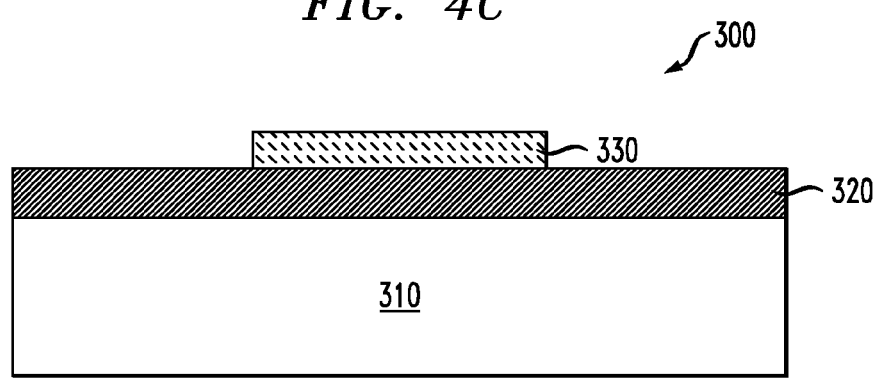

FIGS. 4A through 4C are cross-sectional views depicting exemplary processing steps in the formation of the illustrative MTJ 300 depicted in FIG. 3 prior to patterning and formation of the hard mask, in accordance with an embodiment of the invention. Referring to FIG. 4A, an undesired portion of both the photoresist layer 350 and the ARC layer 340 is removed such as during a photolithography phase of the formation of the hard mask. This leaves an undesired portion of the hard mask material layer 330 exposed for subsequent etching. Alternatively, photolithography can be used to define photoresist layer 350, followed by etching to define the ARC layer 340.

In FIG. 4B, RIE of hard mask material layer 330 is performed. This removes the undesired portion of the hard mask material layer 330, thereby leaving an undesired portion of the magnetic stack layer 320 exposed. Hard mask material layer 330 may be representative of MTJ hard mask layer 145 depicted in FIG. 1. Optionally, although not explicitly shown in FIG. 4B, an etch stop layer may also be utilized, similar to the etch stop layer 150 shown in FIG. 1. The etch stop layer, when used, may be formed on at least a portion of an upper surface of hard mask material layer 330. In either case, the task then remains of removing the residual photoresist layer 350 and ARC layer 340 without etching into the magnetic stack layer 320.

FIG. 4C shows removal of the photoresist layer 350 and ARC layer 340 is a same processing step. In accordance with an aspect of the invention, both the photoresist layer 350 and ARC layer 340 are removed by a wet strip (wet etching) process, leaving the properly formed hard mask 330 over the magnetic stack layer 320. As previously explained, wet etching offers an advantage over other etching processes (e.g., dry etching, etc.) in that wet etching is highly selective with respect to both mask and substrate materials. This leaves the magnetic stack 320 with a clean surface after RIE and without a resist spine which results from conventional resist strips. Because of this clean surface, the field area of the magnetic stack is uniform and the thickness is known. This serves as an ideal starting point for ion mill or RIE of the magnetic stack.

The wet strip is operative to eliminate the need for an ARC layer and photoresist strip process which is conventionally required. Furthermore, because dry etching techniques of the ARC layer, such as, for example, anti-reflective coating overetch (ARCO) and plasma-etching, can be bypassed using techniques of the invention, there is essentially no unwanted polymerization of the magnetic stack.

The exemplary method of forming a self-aligned hard mask for electrically contacting a MTJ is beneficially versatile, utilizable for both larger and smaller MTJ dimensions, including sub-micron and sub-100 nm tunnel junctions, and such process is easily scalable. Both "thick" (e.g., about 100 nm to 200 nm) and "thin" (e.g., about 10 nm to 30 nm) hard masks can be used in accordance with the novel fabrication method, and the method may be used in forming MRAM at current generation nodes as well as next-generation nodes. Embodiments of the invention described herein can be utilized in forming magnetic structures other than MTJ devices. For example, techniques of the invention can be beneficially applied to spin momentum transfer (SMT) devices for use as a magnetic storage element. Moreover, it should be appreciated that the inventive techniques of forming a self-aligned hard mask may be advantageously applied in other types of circuitry and not limited to semiconductor memory devices. For instance, spintronic logic devices and other spintronic circuitry, which utilize the quantum spin of electrons as well as their charge to convey information, may benefit from the techniques of the invention for forming a self-aligned hard mask.

Embodiments of the present invention are well-suited for implementation in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method of forming a hard mask in a semiconductor device which is self-aligned with a magnetic structure formed in the device, the method comprising the steps of:

forming a hard mask material layer on an upper surface of a magnetic stack in the magnetic structure;

forming an anti-reflective coating (ARC) layer on at least a portion of an upper surface of the hard mask material layer, the ARC layer being selected to be removable by a wet etch;

forming a photoresist layer on at least a portion of an upper surface of the ARC layer;

removing at least a portion of the photoresist layer and a part of the ARC layer under the removed portion of the photoresist layer to thereby expose part of the hard mask material layer under the removed part of the ARC layer;

etching the hard mask material layer to remove the exposed part of the hard mask material layer;

performing a wet strip to remove a remaining portions of the ARC layer and a remaining portion of the photoresist layer in a same processing step without interference to the magnetic stack; and forming an etch stop layer on at least the portion of the upper surface of the hard mask material layer under the ARC layer, wherein a thickness of the etch stop layer is greater than a thickness of the hard mask material layer, and wherein the hard mask material layer comprises a conductive material.

2. The method of claim 1, wherein the step of removing at least a the portion of the photoresist layer and the part of the ARC layer under the removed portion of the photoresist layer comprises photolithographic patterning.

3. The method of claim 1, wherein the step of etching the hard mask material layer comprises reactive ion etching.

4. The method of claim 3, wherein the hard mask material layer is selected so that the reactive ion etching stops at a desired cap layer in the device.

5. The method of claim 1, wherein the wet strip of the ARC layer and photoresist layer is operative to provide the magnetic stack with a substantially uniform field area and known thickness.

6. The method of claim 1, wherein the step of performing the wet strip to remove the remaining portions of the ARC layer and the remaining portion of the photoresist layer is operative to eliminate a need for an ARC over-etch (ARCO) step.

7. The method of claim 1, wherein the step of performing the wet strip to remove the remaining portions of the ARC layer and the remaining portion of the photoresist layer is operative to eliminate a need for an ARC layer and photoresist layer strip process.

8. The method of claim 1, wherein the step of performing the wet strip to remove the remaining portions of the ARC layer and the remaining portion of the photoresist layer is operative to substantially eliminate a polymerization of the magnetic stack.

9. The method of claim 1, wherein the step of etching the hard mask material layer comprises selecting a hard mask over-etch chemistry so that a hard mask etch is stopped at a desired cap layer in the device.

10. The method of claim 1, wherein the step of performing a wet strip comprises selecting a material for the ARC layer and a corresponding wet etchant having a high selectivity for etching the ARC layer.

11. The method of claim 10, wherein the material for the ARC layer and the wet etchant are selected such that an etching rate for the ARC layer is substantially higher than respective etching rates for the hard mask material layer and the magnetic stack.

12. The method of claim 1, wherein the steps of forming the ARC and photoresist layers comprises defining the photoresist layer using photolithography and defining the ARC layer by etching the ARC layer.

13. The method of claim 1, wherein the magnetic structure formed in the semiconductor device comprises a magnetic tunnel junction (MTJ).

14. A method of forming a hard mask in a semiconductor device which is self-aligned with a magnetic structure formed in the device, the method comprising the steps of:

forming a hard mask material layer on an upper surface of a magnetic stack in the magnetic structure;

forming an anti-reflective coating (ARC) layer on at least a portion of an upper surface of the hard mask material layer, the ARC layer being selected to be removable by a wet etch;

forming a photoresist layer on at least a portion of an upper surface of the ARC layer;

removing at least a portion of the photoresist layer and a part of the ARC layer under the removed portion of the photoresist layer to thereby expose part of the hard mask material layer under the removed part of the ARC layer;

etching the hard mask material layer to remove the exposed part of the hard mask material layer;

performing a wet strip to remove a remaining portions of the ARC layer and a remaining portion of the photoresist layer in a same processing step without interference to the magnetic stack; and forming an etch stop layer on at least the portion of the upper surface of the hard mask material layer under the ARC layer, wherein the etch stop layer is formed between the portion of the upper surface of the hard mask material layer under the ARC layer and the ARC layer, and wherein the hard mask material layer comprises a conductive material and is distinct from the magnetic stack.

* * * * *